United States Patent
Lim et al.

(10) Patent No.: US 12,125,518 B2
(45) Date of Patent: Oct. 22, 2024

(54) METHOD AND APPARATUS OF RECEIVE ENABLE MARGINING IN MEMORY INTERFACE

(71) Applicant: SKYECHIP SDN BHD, Bayan Lepas (MY)

(72) Inventors: Soon Chieh Lim, Bayan Lepas (MY); Hoong Chin Ng, Bayan Lepas (MY); Ching Liang Ooi, Bayan Lepas (MY); Chee Hak Teh, Bayan Lepas (MY)

(73) Assignee: SkyeChip Sdn Bhd, Bayan Lepas (MY)

( * ) Notice: Subject to any disclaimer, the term of this patent is extended or adjusted under 35 U.S.C. 154(b) by 227 days.

(21) Appl. No.: 17/723,757

(22) Filed: Apr. 19, 2022

(65) Prior Publication Data

US 2023/0230628 A1   Jul. 20, 2023

(30) Foreign Application Priority Data

Jan. 20, 2022   (MY) .............................. PI2022000379

(51) Int. Cl.
*G11C 11/4076* (2006.01)

(52) U.S. Cl.
CPC ................................ *G11C 11/4076* (2013.01)

(58) Field of Classification Search
CPC .................................................. G11C 11/4076
See application file for complete search history.

(56) References Cited

U.S. PATENT DOCUMENTS

| | | | |
|---|---|---|---|
| 7,590,008 | B1 | 9/2009 | Roge et al. |
| 7,876,630 | B1 | 1/2011 | Clarke et al. |
| 7,924,637 | B2 | 4/2011 | Searles et al. |
| 7,990,783 | B1 | 8/2011 | Clarke et al. |
| 10,269,443 | B2 | 4/2019 | Yu et al. |

FOREIGN PATENT DOCUMENTS

CN   108511030   9/2018

*Primary Examiner* — Alfredo Bermudez Lozada
(74) *Attorney, Agent, or Firm* — HSML P.C.

(57) ABSTRACT

The present invention relates to a method and apparatus of calibrating memory interface, wherein said method and apparatus is able to periodically re-adjust the placement of the receive enable signal in order to have said receive enable signal to be in an optimum position in relation to the DQS signal from an external memory device to achieve maximum timing margin regardless of voltage or temperature drift and/or process aging to the integrated circuit.

4 Claims, 6 Drawing Sheets

METHOD AND APPARATUS OF RECEIVE ENABLE MARGINING IN MEMORY INTERFACE

1. TECHNICAL FIELD OF THE INVENTION

The present invention relates to a method and apparatus of calibrating memory interface, wherein said method and apparatus is able to periodically re-adjust the placement of the receive enable signal in order to have said receive enable signal to be in an optimum position in relation to the DQS signal from an external memory device to achieve maximum timing margin regardless of voltage or temperature drift and/or process aging to the integrated circuit.

2. BACKGROUND OF THE INVENTION

DDR 4 and DDR 5 are one of the many memory interface protocols used by integrated circuits to transfer data to and from an external memory device. In a DDR4 and/or DDR5 memory subsystem, during memory read operations, the memory controller in the Host integrated circuit will send a read command to the external DRAM memory device. The external DRAM memory device will respond by sending back to the Host, the read data. The external DRAM memory device will also send a strobe together with the read data, said strobe will be used by the Host to sample the read data. The strobe is generally known as data strobe (DQS) signal while the data is known as DQ.

For DDR4 or DDR5 memory protocols, the data strobe (DQS) is bidirectional. Therefore, there is a need for the host memory controller interface to have a receive enable signal that enables or qualifies the DQS as an input pin when the external memory device is sending read data to the host memory controller. The receive enable will gate off the DQS otherwise.

According to the DDR4 or DDR5 protocol specification, the read strobe, DQS (which is actually a pair of differential signals DQS_t and DQS_c) could be tristated (or high-Z) or in an unknown state (1 or 0) before the read data, DQ, is sent, and is driven with a deterministic toggling pattern during data is sent, and is back to tristate or unknown state after the last read data has been sent. FIG. 1A shows the unknown state of DQS before and after DQ.

For the Host, an unknown state of the DQS is undesirable because if used directly, it will cause unknown or X's to be propagated into the DQ sampling logic, thus causing it to sample wrong data. Hence the Host will generally 'gate' or filter the DQS with an internally generated 'receive enable' signal. The 'receive enable' signal is asserted right after the DQS strobe transitions from unknown state to 0 state. The 'receive enable' signal is then de-asserted right after the reception of the last read data sent by the external memory device, as shown in FIG. 1B.

FIG. 2 shows the conceptual view of the circuit to gate the DQS strobe before the strobe is used as a clock to sample incoming DQ data (405). As shown in FIG. 3A, if the 'receive enable' signal is asserted too early before the DQS transitions from unknown state to 0 state, then it will still pass an unknown pulse to the DQ sampling logic, which is undesirable as it will cause a non-deterministic capture of DQ. As shown in FIG. 3B, if the 'receive enable' signal is asserted too late after the DQS makes the first valid 0->1 transition, it will cause a shorter pulse on the gated strobe, or worst still a missing pulse. The first DQ data (405) might not be captured correctly. Therefore, the 'receive enable' signal has to be timed correctly so that the DDR4 or DDR5 read data can be correctly transferred from the external memory device to the Host.

Another problem faced by the host memory controller, is that even though initially the receive enable signal is timed correctly, the timing may also drift to become incorrect or inaccurate due to the temperature and voltage drift, as well as process aging of the integrated circuit and/or external memory device. This means that the initial setting that was found during initial system boot up may no longer optimum anymore.

Hence, it would be advantageous to alleviate the shortcomings by having a method and apparatus of calibrating memory interface, whereby the host memory controller is able to periodically re-adjust the placement of the receive enable signal so that the signal is in an optimum position in relation to the DQS signal from the external memory device and to continuously perform monitoring to ensure the relative position is maintained even though the position may drift due to voltage or temperature drift or process aging of the integrated circuit.

3. SUMMARY OF THE INVENTION

Accordingly, it is the primary aim of the present invention to provide a method and apparatus of calibrating memory which is able determine an optimum relative timing position between the receive enable signal and the DQS signals.

It is yet another objective of the present invention to provide a method and apparatus of calibrating memory which is able maintain an optimum relative timing position between the receive enable signal and the DQS sign even though said relative timing position may drift across time.

Additional objects of the invention will become apparent with an understanding of the following detailed description of the invention or upon employment of the invention in actual practice.

According to the preferred embodiment of the present invention the following is provided:

A method of calibrating memory interface, comprising the following steps:
 i. a memory controller generating gated strobe signal for DQ data from an external memory device, wherein said gated strobe signal is gated by DQS signal from said external memory device and a receive enable signal, wherein said receive enable signal is generated by a receive enable generation circuit in a memory controller after propagating through a first delay element in said memory controller;
 ii. said memory controller having a first sampling element, sampling a string of DQS pulses from said external memory device to obtain value of first delay element when sampling output value of said first sampling element is 1;
 iii. said memory controller adjusting said value of first delay element to position the output of first delay element earlier, to substantially centre of a first read preamble phase of DQS signal from said external memory device;
 iv. said memory controller, using a third sampling element, sampling a string of DQS pulses from said external memory device to obtain value of said third delay element when the sampling output value of said third sampling element is a transition from the first phase of read preamble to second phase of read preamble; wherein said third delay element is connected after said first delay element;

v. said memory controller adjusting a second delay element so that the sampling output value of a second sampling element is in a suitable position before said transition from the low phase of read preamble to the high phase of the first DQS pulse; and said memory controller adjusting a fourth delay element so that the sampling output value of a fourth sampling element is in a suitable position after said transition from the low phase of read preamble to the high phase of the first DQS pulse; wherein said sampling output value of said second sampling element and fourth sampling element output complement each other; wherein said second delay element is connected between said first delay element and third delay element; wherein said fourth delay element is connect after said third delay element;

vi. said memory controller periodically monitoring said sampling output value of said second sampling element and sampling output value of said fourth sampling element to ensure that said sampling output value of said second sampling element and the sampling output value of said fourth sampling element complement each other;

wherein Step (vi) is repeated as the memory controller generates said gated strobe signal.

In another embodiment of the invention there is provided:
A method of calibrating memory interface, comprising the following steps:

i. a memory controller generating gated strobe signal for DQ data from an external memory device, wherein said gated strobe signal is gated by DQS signal from said external memory device and a receive enable signal, wherein said receive enable signal is generated by a receive enable generation circuit in a memory controller after propagating through a first delay element in said memory controller;

ii. said memory controller having a first sampling element, sampling a string of DQS pulses from said external memory device to obtain value of first delay element when sampling output value of said first sampling element is 1;

iii. said memory controller adjusting said value of first delay element to position of the delay output of first delay element earlier by 2.5 unit interval (UI) from the initial position of the delay output of the first delay element;

iv. said memory controller, using a third sampling element, sampling a string of DQS pulses from said external memory device to obtain value of said third delay element when the sampling output value of said third sampling element is 0;

v. said memory controller adjusting the third delay element until the position of delay output of said third delay element where the sampling output of the third sampling element captures a 0; wherein said second delay element is connected between said first delay element and third delay element; wherein said fourth delay element is connected after said third delay element;

vi. said memory controller periodically monitoring said sampling output value of said second sampling element and sampling output value of said fourth sampling element to ensure that said sampling output value of said second sampling element and the sampling output value of said fourth sampling element complement each other;

wherein Step (vi) is repeated as the memory controller generates said gated strobe signal.

In another embodiment of the invention there is provided:
A memory interface calibration circuit comprising:
a memory controller capable of generating gated strobe signal for DQ data from external memory device, said memory controller comprising of:
a receive enable signal generation circuit;
characterized in that
said memory controller further comprises of a signal sampling circuit comprising of a plurality of sampling elements;
said memory controller further comprises of a signal delay circuit comprising of a plurality of delay elements;
said gated strobe signal is gated by DQS signal from said external memory device and receive enable signal generated by said receive enable signal generation circuit after propagating through a first delay element in said signal delay circuit;
said sampling elements in said signal sampling circuit capable of sampling DQS signal from said external memory devices;
wherein each sampling output of said sampling element is gated by a delay output of a corresponding delay element.

4. BRIEF DESCRIPTION OF THE DRAWINGS

Other aspect of the present invention and their advantages will be discerned after studying the Detailed Description in conjunction with the accompanying drawings in which.

5. DETAILED DESCRIPTION OF THE DRAWINGS

In the following detailed description, numerous specific details are set forth in order to provide a thorough understanding of the invention. However, it will be understood by the person having ordinary skill in the art that the invention may be practiced without these specific details. In other instances, well known methods, procedures and/or components have not been described in detail so as not to obscure the invention.

The invention will be more clearly understood from the following description of the embodiments thereof, given by way of example only with reference to the accompanying drawings, which are not drawn to scale.

During initial system boot up, the method and apparatus of the present invention presents the host memory controller that will train or calibrate the receive enable signal (411) so that it is placed in an optimum position, relative to DQS, for maximum timing margin.

Figure 4:
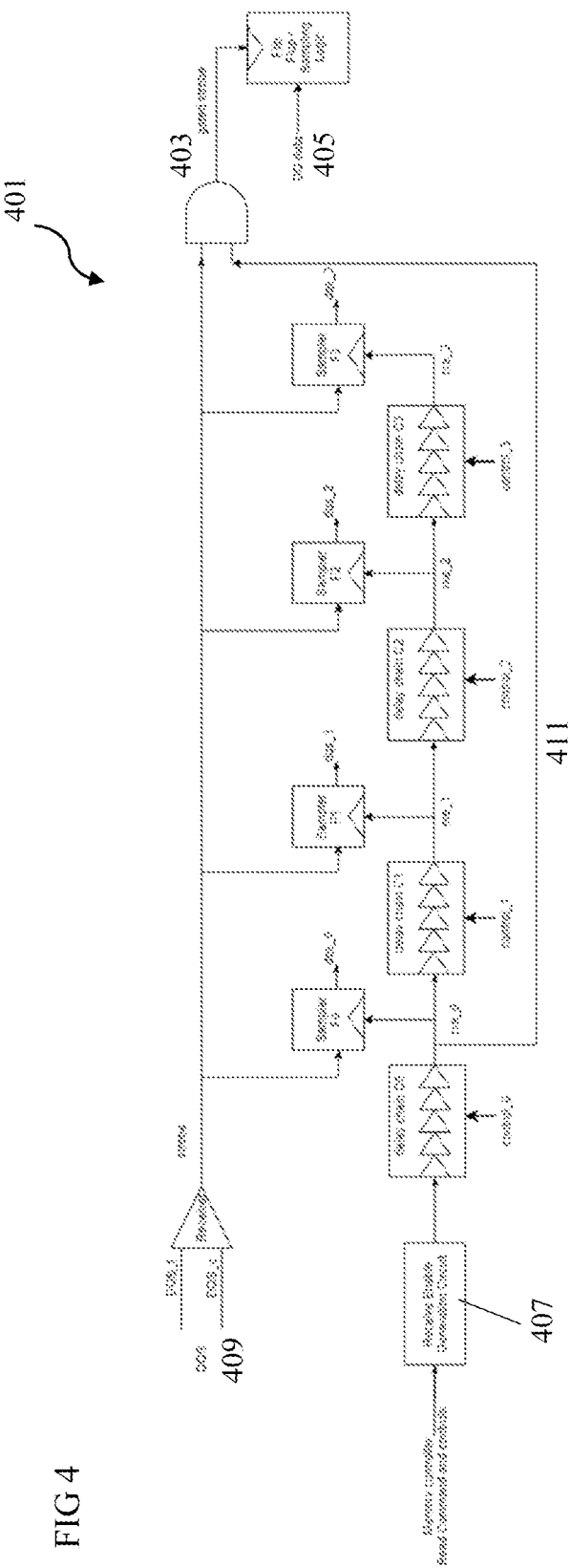
FIG. 4 shows the apparatus of the present invention.

As shown in FIG. 4, the present invention proposes a memory interface calibration circuit (401) comprising of a memory controller capable of generating gated strobe signal (403) for DQ data (405) from external memory device, said memory controller comprising of a receive enable signal generation circuit (407). The memory controller further comprises of a signal sampling circuit comprising of a plurality of sampling elements (F0, F1, F2, F3). The memory controller further comprises of a signal delay circuit comprising of a plurality of delay elements (C0, C1, C2, C3). In one example, there are four sampling elements in the signal sampling circuit, namely a first sampling element (F0), a second sampling element (F1), a third sampling element (F2) and a fourth sampling element (F3); and four corresponding delay elements, namely a first delay element (C0), a second delay element (C1), a third delay element (C2) and a fourth delay element (C3). These delay elements and sampling elements are essential to the present invention. The second delay element (C1) is connected between said first delay element (C0) and third delay element (C2); wherein said fourth delay element (C3) is connect after said third delay element (C2).

The gated strobe signal (403) is AND gated by DQS signal (409) from said external memory device and receive enable signal (411) generated by said receive enable signal generation circuit (407) after propagating through a first delay element (C0) in said signal delay circuit. The sampling elements (F0, F1, F2, F3) in said signal sampling circuit is capable of sampling DQS signal (409) from said external memory devices; wherein each sampling output of said sampling element is gated by a delay output of a corresponding delay element.

The first delay element (C0) delays the receive enable signal (411) generated from the receive enable signal generation circuit (407) and use the first delayed receive enable signal, named hereinafter as rxe_0 to sample the DQS strobe from the external memory device, using the first sampling element (F0). The sampling output from the first sampling element (F0) is hereinafter named as dqs_0. With the flip-flop structure of the first sampling element (F0), the dqs_0 signal from the first sampling element (F0) is used to represent the 'gated strobe' from the gating AND gate, but with two following conditions. Firstly, the sampling elements are constructed with a similar timing characteristic to the gated strobe AND gate in both setup time and hold time. Secondly, the delays to the sampling element (F0) and the gated strobe AND gate on both the output of the gated strobe AND gate, strobe and rxe_0 signals are matched.

Figure 1A:
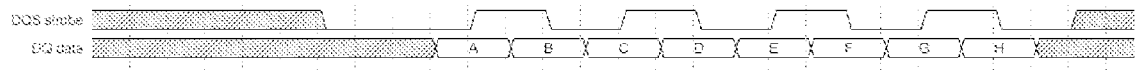
FIG. 1A is a timing diagram showing the unknown state of the DQS before and after DQ.
Figure 1B:
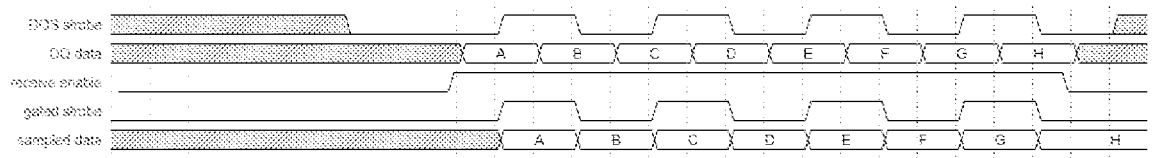
FIG. 1B is a timing diagram showing the timing of the receive enable signal being asserted and de-asserted.
Figure 2:
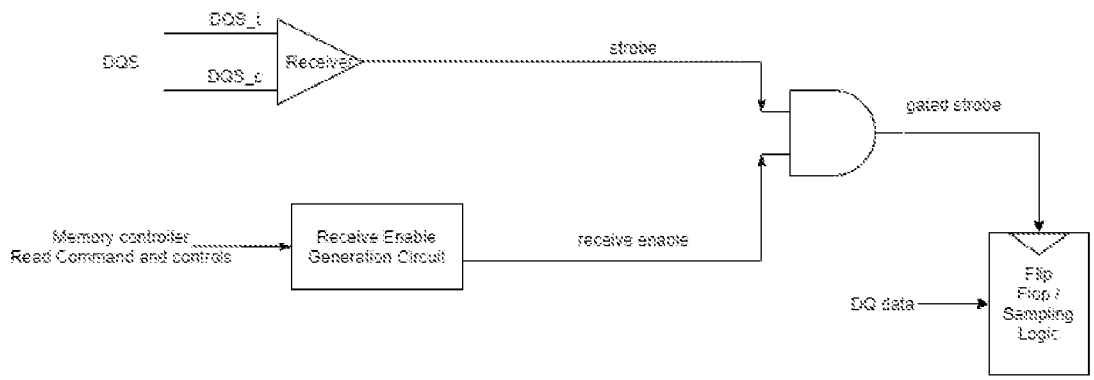
FIG. 2 shows a circuit diagram of a conventional receive enable circuitry.
Figure 3A:
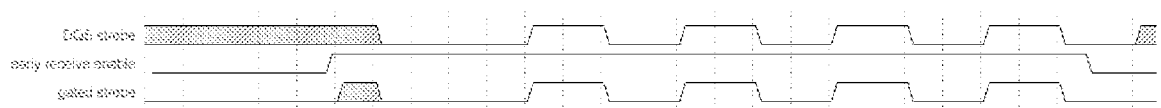
FIGS. 3A and 3B show timing diagrams of the receive enable signal being asserted too early and too late, causing problem to conventional circuitries.
Figure 3B:
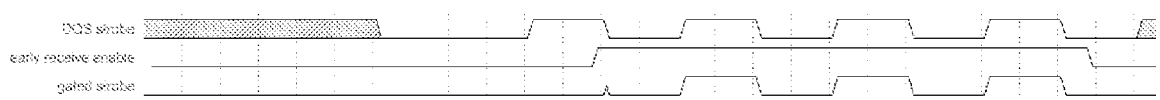

Similarly, the sampling output of the second sampling element (F1) is named as dqs_1, the sampling output of the third sampling element (F2) is named as dqs_2, and the sampling output of the fourth sampling element (F3) is named as dqs_3. Dqs_1, dqs_2 and dqs_3 also represent delayed samples of the 'gated strobe'. The first delayed receive enable signal/delay output of first delay element, rxe_0 is also used to gate the DQS strobe as in FIG. 2, where the resultant gated strobe will be used to sample the incoming DQ data (405). The second delay element (C1) is used to delay rxe_0 to generate the second delayed receive enable signal, rxe_1, where it is then used to sample again the DQS strobe. The sampling output from the second sampling element (F1) is dqs_1. The third delay element (C2) is used to delay rxe_1 to generate the third delayed receive enabled signal, rxe_2, where it is then used to sample again the DQS strobe. The sampling output from the third sampling element (F2) is dqs_2. The fourth delay element (C3) is used to delay rxe_2 to generate rxe_3, where it is then used to sample again the DQS strobe. The sampling output from the second sampling element (F3) is dqs_3.

The amount of delay through the first delay element (C0) can be controlled by a signal control_0. The amount of delay through the second delay element (C1) can be controlled by a signal control_1. In some embodiments, the control_1 signal can be optionally fixed so that the delay between rxe_0 and rxe_1 is fixed. The amount of delay through the third delay element (C2) can be controlled by a signal control_2. In some embodiments, the control_2 signal can be optionally fixed so that the delay between rxe_1 and rxe_2 is fixed. The amount of delay through the fourth delay element (C3) can be controlled by a signal control_3. In some embodiments, the control_3 signal can be optionally fixed so that the delay between rxe_2 and rxe_3 is fixed.

The present invention also proposes a method of calibrating memory interface, comprising the following steps. In Step (i), a memory controller generates gated strobe signal (403) for DQ data (405) from an external memory device, wherein said gated strobe signal (403) is gated by DQS signal (409) from said external memory device and a receive enable signal (411), wherein said receive enable signal (411) is generated by a receive enable signal generation circuit (407) in a memory controller after propagating through a first delay element (C0) in said memory controller.

Figure 5A:
FIG. 5A is a timing diagram of the DQS strobe in pre-requisite condition for the receive enable training.

In Step (ii), the memory controller having a first sampling element, samples a string of DQS pulses from said external memory device to obtain value of first delay element (C0) when sampling output value of said first sampling element (F0) is 1. Before Step (ii) (receive enable training) is done, the pre-requisite is that the external memory device must first be pre-charged (all banks closed and pre-charged) before the external memory device is configured in the read-preamble training mode. Examples of method to pre-charge the external memory device is by issuing a Mode Register Write (MRW) for DDR5 interface or issuing a Mode Register Set (MRS) for DDR4, for the external memory device to drive the DQS signal (409) in the deterministic 0 state, as shown in FIG. 5A. Various methods to pre-charge said external memory device can be done, but importantly, the external memory device needs to be configured for read preamble training mode (i.e. external memory device driving DQS deterministic 0 state), before Step (ii)(receive enable training) can be implemented.

Figure 5B:
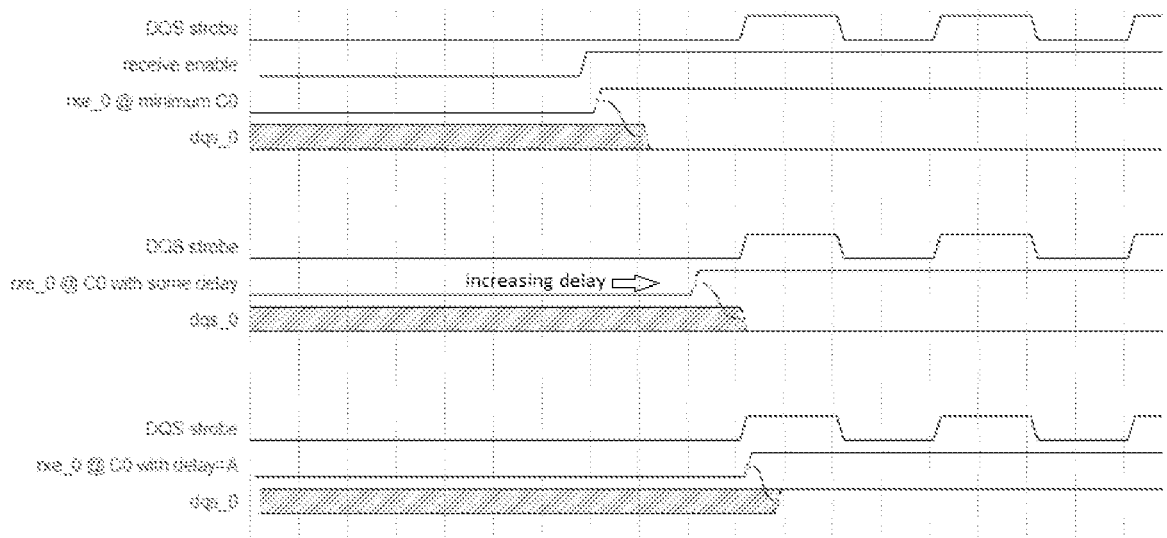
FIG. 5B is a timing diagram showing the process of obtaining the value of the first delay element in Step (ii) of the present invention.

In Step (ii), the following are the sub-steps. In Step (ii)(a), the first delay element (C0) in said host memory controller is set to minimum delay. This way, the DQS strobe will be in the deterministic 0 state, as shown in FIG. 5A. As shown in FIG. 5B, in Step (ii)(b), the memory controller is configured to send a read command to said external memory device to trigger said external memory device to send a string of DQS pulses (409), while the memory controller generates a read enable indication that is then converted into a receive enable signal (411) by the receive enable signal generation circuit (407). In view that the first delay element (C0) is at a minimum delay, the first sampling element (F0) will sample the early DQS strobe at state 0, i.e. dqs_0=0. In Step (ii)(c), the first sampling element (F0) in said memory controller samples the DQS signal (409) from said external memory device. In Step (ii)(d), the memory controller checks the sampling output of said first sampling element (F0), dqs_0. If the sampling output of said first sampling element (F0) dqs_0 is 0, steps (ii)(b) to (ii)(d) are repeated with said memory controller increasing delay to said first delay element (C0) until said sampling output value of said first sampling element (F0) dqs_0 is 1. The value of first delay element (C0), control_0, when sampling output value of said first sampling element (F0) dqs_0 is 1, is recorded, as A. From these steps, the left edge of the first DQS pulse is found.

The process will then exit the read preamble training mode to have regular DQS pulses (409) to be driven by the external memory device. It is important to note that the DQS signal (409) is now being weak-pull-up to HIGH state. Memory interfaces such as DDR4 or DDR5 supports a few flavours on the amount of DQS preamble being sent by the external memory device to the Host memory controller, as shown in FIG. 5C.

Figure 5C:
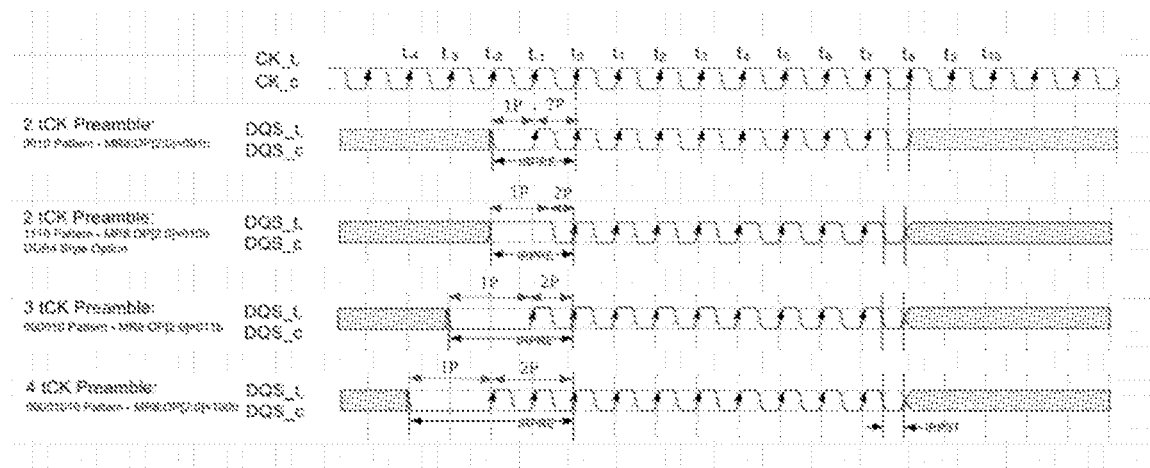
FIG. 5C shows the different kinds of DQS preambles that is configurable from a DDR5 DRAM.
Figure 5D:
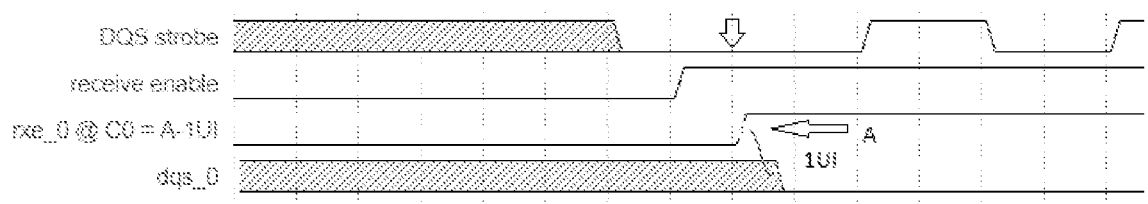
FIG. 5D are timing diagrams showing the first read preamble phased of the DQS signal as explained in Step (iii) of the present invention.

In Step (iii), the memory controller adjusts the value of first delay element (C0), control_0, to position the delay output of first delay element (C0), rxe_0 earlier, so that rxe_0 lands to substantially centre of a first read preamble phase (1P) of DQS signal (409) from said external memory device according to the read preamble settings configured as shown in FIG. 5C. Based on the different read preamble settings, we will subtract the value of control_0 recorded in Step (ii) until the rxe_0 signal is at the centre of the first read preamble phase (1P), as shown in FIG. 5D.

Figure 5E:
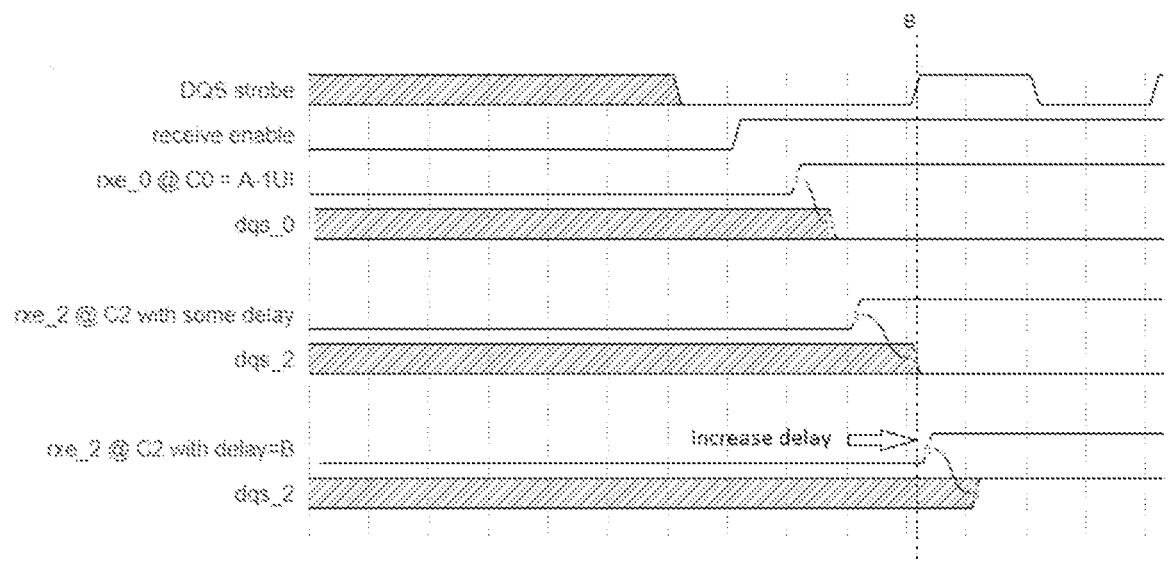
FIG. 5E is a timing diagram showing how Steps (iv)(a) to (iv)(c) are repeated in the present invention.

In Step (iv), as shown in FIG. 5E, the memory controller, using the third sampling element (F2), samples a string of DQS pulses (409) from said external memory device to obtain value of said third delay element (C2) when the sampling output (dqs_2) value of said third sampling element (F2) is a transition from the first phase of read preamble to second phase of read preamble; wherein said third delay element (C2) is connected after said first delay element (C0). Step (iv) comprises of the following sub-steps. In Step (iv)(a), the memory controller sends a read command to said external memory device to trigger said external memory device to send a string of DQS pulses (409) while said memory controller generating a read enable indication that is then converted into a receive enable signal (411) by said receive enable signal generation circuit (407). In Step (iv)(b), the third sampling element (F2) in the memory controller samples the DQS signal (409) from said external memory device. In Step (iv)(c), the memory controller checks the sampling output (dqs_2) of said third sampling element (F2). Steps (iv)(a) to (iv)(c) are repeated and the memory controller increases delay to said third delay element (C2), control_2, until the sampling output (dqs_2) value of said third sampling element (F2) is a transition from first phase of read preamble (1P) to second phase of read preamble (2P). This transition can also be regarded as the rising edge of the DQS strobe. The value of said third delay element (C2), control_2, when said transition is detected, is recorded, as B. Now the dqs_2 signal will land on the transition edge from first phase (1P) to second phase (2P) of read preamble.

Figure 5F:
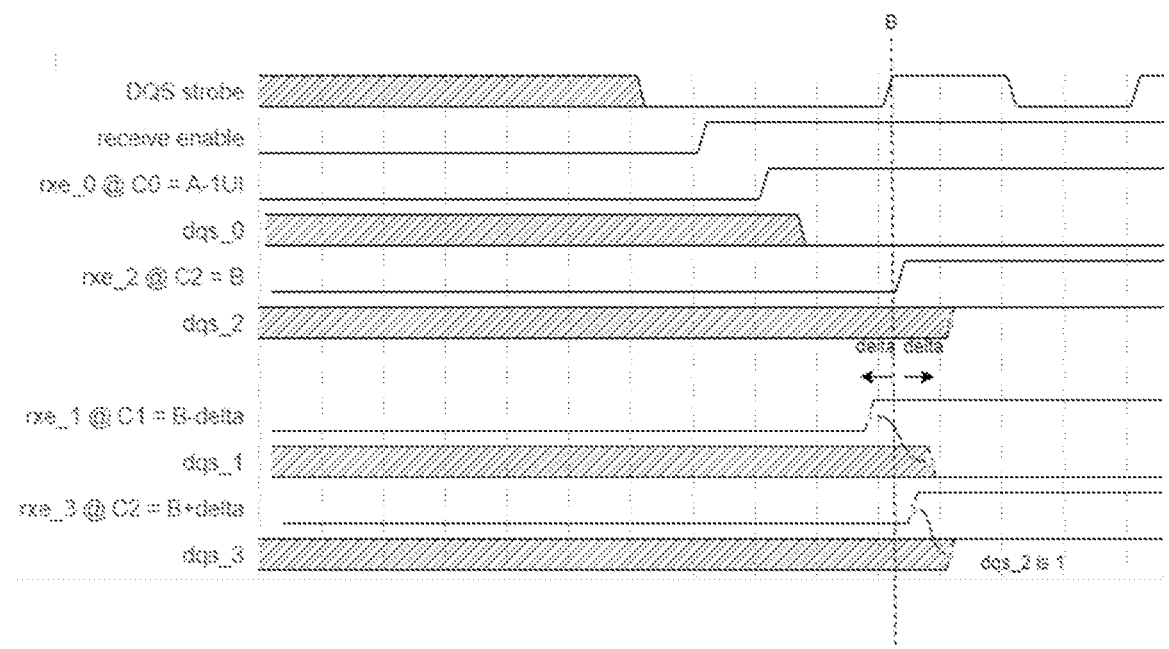
FIG. 5F is a timing diagram showing how Step (v) is implemented in the present invention.

The method and apparatus of the present invention ensures that the dqs_1 signal is positioned before said transition edge with some delays and the dqs_3 signal is positioned after said transition edge with some delays. In Step (v), the memory controller adjusts a second delay element (C1) so that the sampling output (dqs_1) value of a second sampling element (F1) is in a suitable position (−delta) before said transition from the low phase of read preamble to the high phase of the first DQS pulse; and said memory controller adjusting a fourth delay element (C3) so that the sampling output (dqs_3) value of a fourth sampling element (F3) is in a suitable position (+delta) after said transition from the low phase of read preamble to the high phase of the first DQS pulse. For example, the second delay element (C1) delay is set to B−delta, the third delay element (C2) delay is set to delta, and the fourth delay element (C3) delay is set to delta. The resultant delay on rxe_1 is B−delta, rxe_2 is B, and rxe_3 is B+delta. FIG. 5F depicts the outcome.

It is important that the sampling output (dqs_1) value of said second sampling element (F1) and fourth sampling element (F3) output (dqs_3) should always complement each other. After Step (v), the initial receive enable calibration flow is done.

Figure 5G:
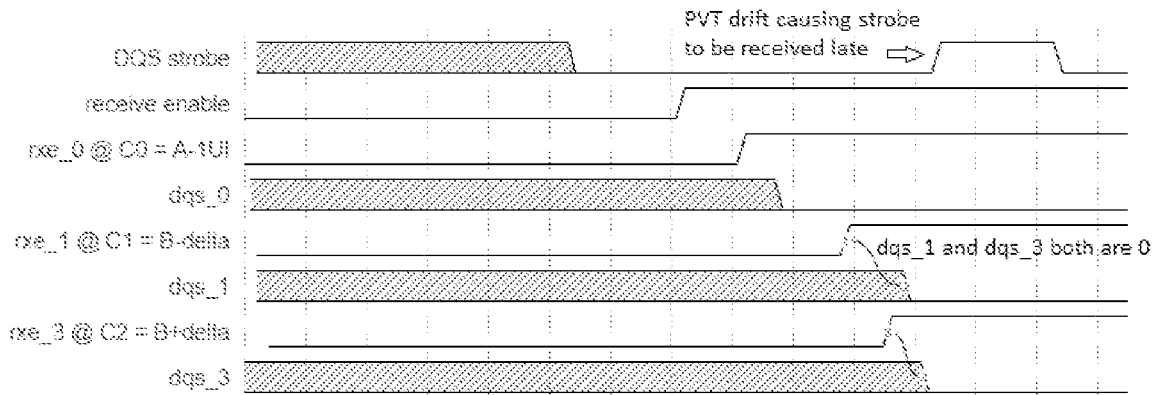
FIG. 5G is a timing diagram showing both dqs_1 and dqs_3 being the same.
Figure 5H:
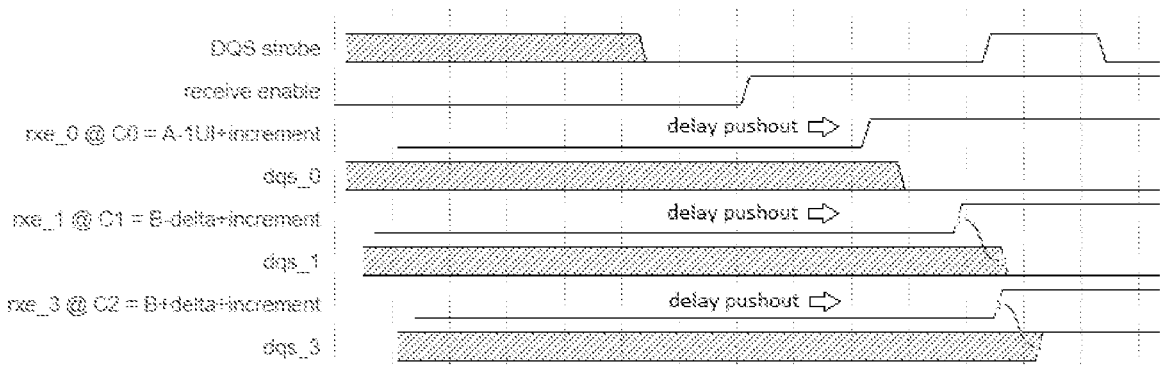
FIG. 5H is a timing diagram showing that C1, C2, C3 are being pushed out because of C0.

After the calibration flow is completed, Step (vi) is done, whereby the memory controller periodically monitors said sampling output value of said second sampling element, dqs_1 and sampling output value of said fourth sampling element (F3), dqs_3 to ensure that said sampling output value of said second sampling element, dqs_1 and the sampling output value of said fourth sampling element (F3), dqs_3 complement each other. Step (vi) comprises of the following sub-steps. In Step (vi)(a), the memory controller periodically monitors said output value of said second sampling element, dqs_1 and output value of said fourth sampling element (F3), dqs_3. If both dqs_1 and dqs_3 are equal (i.e both ones or both zeroes) as shown in FIG. 5G, it means that the DQS strobe has drifted due to process/voltage/temperature variation over time. In Step (vi)(b), if the output value of the second sampling element and the output value of the fourth sampling element (F3) are both 0, said memory controller increases the value of the first delay element (C0); while if the output value of the second sampling element (F1) and the output value of the fourth sampling element (F3) are both 1, said memory controller decreases the value of the first delay element (C0). Step (vi)(b) is repeated until the sampling output (dqs_1) value of the second sampling element (F1) complements the sampling output (dqs_3) value of the fourth sampling element (F3). By increasing or decreasing C0, the invention is essentially pushing out or pulling in the second delay element (C1), third delay element (C2) and the third delay element (C2) since they come after C0, so that dqs_1 and dqs_3 are complements of each other again. Step (vi) is repeated to continuously adjust for the process/voltage/temperature variations as the memory controller generates said gated strobe signal (403). Since rxe_0 is used to gate the DQS input strobe, this ensures that there is always sufficient margin from the rise of rxe_0 to the rise of the first DQS strobe, as shown in FIG. 5H.

Figure 6A:
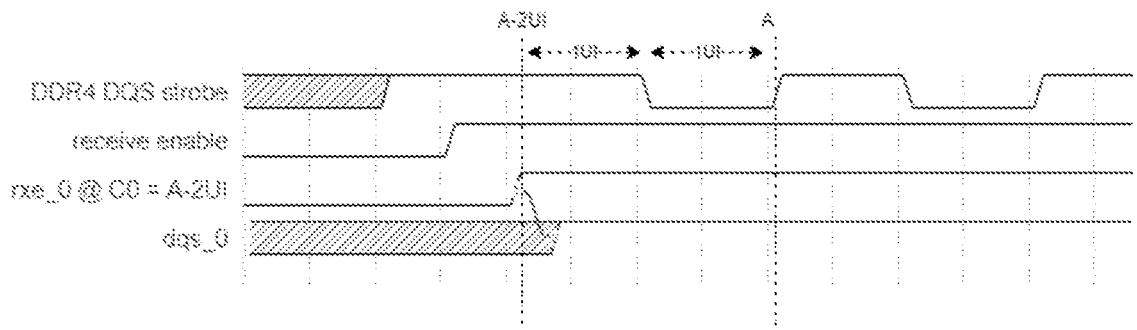
FIGS. 6A, 6B and 6C are timing diagrams showing the implementation of the present invention in some particular DDR4 applications.
Figure 6B:
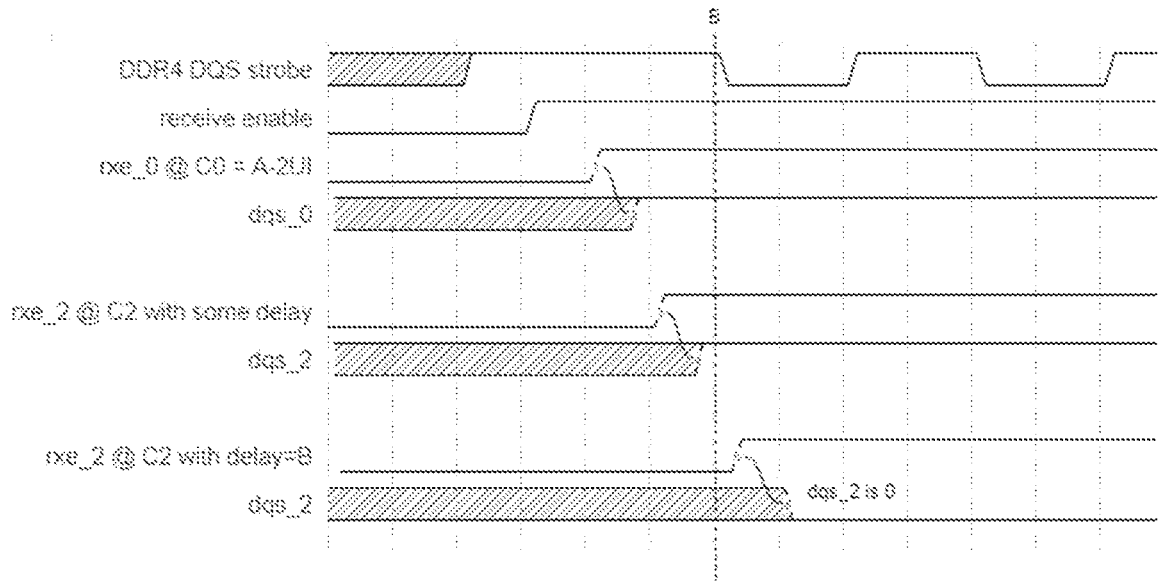
Figure 6C:
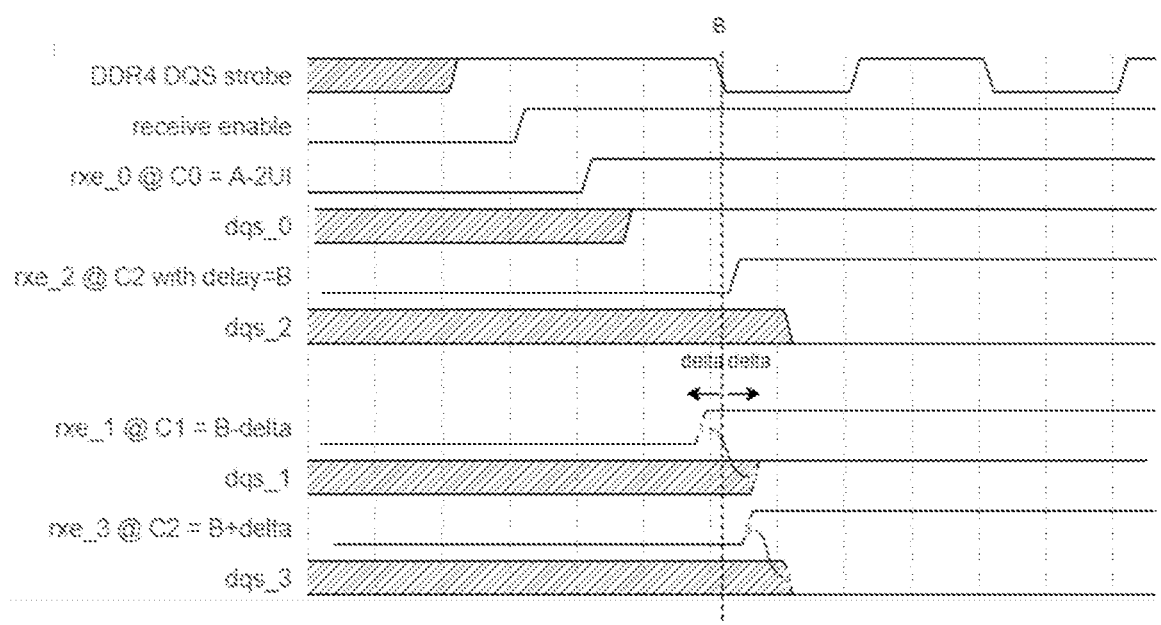

In some memory interface applications, particularly in some DDR4 applications, it may be desirable to land the receive enable on a location where the DQS strobe is 1. In this case, the methods as mentioned above can be performed with several alterations. In Step (iii), instead of having the rxe_0 to land to substantially centre of the first read preamble phase (1P) of DQS signal (409), rxe_0 should be deducted by 2.5 unit intervals (UI) from the value of A obtained for the first delay element (C0), as shown in FIG. 6A. In Step (iv), said memory controller, using a third sampling element (F2), samples a string of DQS pulses (409) from said external memory device to obtain value of said third delay element (C2) when the sampling output (dqs_2) value of said third sampling element (F2) is 0. In Step (v), instead of adjusting the second delay element (C1) so that the second sampling element (F1) is in a suitable position before the transition from the low phase of read preamble to the high phase of the first DQS pulse and adjusting the fourth delay element (C3) so that the fourth sampling element (F3) is in a suitable position after the transition from the low phase of read preamble to the high phase of the first DQS pulse, the third delay element (C2) should be adjusted until the position of rxe_2 where dqs_2 is capturing a 0, as shown in FIG. 6B. As in step (v), the invention positions rxe_1 to be B−delta, and rxe_3 to be B+delta, as shown in FIG. 6C. Hence, the initial calibration is done. For periodic calibration to account for process/voltage/temperature drift, the invention can detect the event where dqs_1 and dqs_3 are equal. In Step (vi)(b), the C0 is decreased (if both dqs_1 and dqs_2 are 0), or C0 increased (if both dqs_1 and dqs_2 are 1).

While the present invention has been shown and described herein in what are considered to be the preferred embodiments thereof, illustrating the results and advantages over the prior art obtained through the present invention, the invention is not limited to those specific embodiments. Thus, the forms of the invention shown and described herein are to be taken as illustrative only and other embodiments may be selected without departing from the scope of the present invention, as set forth in the claims appended hereto.

What is claimed is:

1. A method of calibrating memory interface, comprising:
   i. a memory controller generating a gated strobe signal for DQ data from an external memory device, wherein said gated strobe signal is gated by a DQS signal from said external memory device and a receive enable signal, wherein said receive enable signal is generated by a receive enable signal generation circuit in the memory controller after propagating through a first delay element in said memory controller;
   ii. said memory controller having a first sampling element, sampling a string of pulses in said DQS signal from said external memory device to obtain a value of a first delay element when a sampling output value of said first sampling element is 1;
   iii. said memory controller adjusting said value of the first delay element to position a delay output of the first delay element earlier, to substantially centre of a first read preamble phase of the DQS signal from said external memory device;
   iv. said memory controller, using a third sampling element, sampling the string of pulses in said DQS signal from said external memory device to obtain a value of a third delay element when a sampling output value of said third sampling element is a transition from a first phase of read preamble to a second phase of read preamble; wherein said third delay element is connected after said first delay element;
   v. said memory controller adjusting a second delay element so that a sampling output value of a second sampling element is in a suitable position before a transition from a low phase of read preamble to a high phase of a first DQS pulse of the string of pulses in said DQS signal; and said memory controller adjusting a fourth delay element so that a sampling output value of a fourth sampling element is in a suitable position after a transition from the low phase of read preamble to the high phase of the first DQS pulse; wherein said sampling output value of said second sampling element and fourth sampling output complement each other; wherein said second delay element is connected between said first delay element and third delay element; wherein said fourth delay element is connected after said third delay element;
   vi. said memory controller periodically monitoring said sampling output value of said second sampling element and sampling output value of said fourth sampling element to ensure that said sampling output value of said second sampling element and the sampling output value of said fourth sampling element complement each other;

wherein (vi) is repeated as the memory controller generates said gated strobe signal.

2. The method of calibrating memory interface as claimed in claim 1, wherein (ii) comprises:
   (a) setting the first delay element in said memory controller to minimum delay;
   (b) said memory controller sending a read command to said external memory device to trigger said external memory device to send the string of pulses in said DQS signal; while said memory controller generating a read enable indication that is then converted into a receive enable signal by said receive enable signal generation circuit;
   (c) the first sampling element in said memory controller sampling the DQS signal from said external memory device;
   (d) said memory controller checking the sampling output of said first sampling element, wherein if said sampling output of said first sampling element is 0, repeating (b) to (d) and said memory controller increasing delay to said first delay element until said sampling output value of said first sampling element is 1; wherein said value of said first delay element, when sampling output value of said first sampling element is 1, is recorded.

3. The method of calibrating memory interface as claimed in claim 1, wherein (iv) comprises:
   (a) said memory controller sending a read command to said external memory device to trigger said external memory device to send the string of pulses in said DQS signal; while said memory controller generating a read enable indication that is then converted into a receive enable signal by said receive enable signal generation circuit;
   (b) the third sampling element in said memory controller sampling the DQS signal from said external memory device;
   (c) said memory controller checking the sampling output of said third sampling element;

wherein repeating (a) to (c) and said memory controller increasing delay to said third delay element until said sampling output value of said third sampling element is a transition from the first phase of read preamble to the second phase of read preamble; wherein value of said third delay element when said transition is detected, is recorded.

4. The method of calibrating memory interface as claimed in claim 1, wherein (vi) comprises:

(a) said memory controller periodically monitoring said sampling output value of said second sampling element and sampling output value of said fourth sampling element;

(b) if the sampling output value of the second sampling element and the sampling output value of the fourth sampling element are both 0, said memory controller increasing the value of the first delay element; while if the sampling output value of the second sampling element and the sampling output value of the fourth sampling element are both 1, said memory controller decreasing the value of the first delay element;

wherein (b) is repeated until the sampling output value of the second sampling element complements the sampling output value of the fourth sampling element.

* * * * *